Sept. 8, 1964 F. J. BESTE, JR 3,148,098

METHOD OF PRODUCING ELECTRICAL COMPONENTS

Filed Nov. 3, 1960

INVENTOR.
FREDERICK J. BESTE, JR.

BY

Morgan, Finnegan, Durham & Pine
ATTORNEYS

United States Patent Office 3,148,098

Patented Sept. 8, 1964

3,148,098
METHOD OF PRODUCING ELECTRICAL COMPONENTS

Frederick John Beste, Jr., Timonium, Md., assignor, by mesne assignments, to Day Company, N.V., a Curacao corporation Filed Nov. 3, 1960, Ser. No. 66,997
4 Claims. (Cl. 156—6)

This invention relates to methods for producing electrical components and assemblies thereof and more particularly to multiple stage methods for forming electrical components and assemblies thereof from stock.

One class of electrical components and assemblies to which the present invention relates is frequently characterized by the term "printed circuits." (The term "circuit" will be used to signify one or more conductors, combinations thereof, electrical, including magnetic components per se, or such components and associated conductors.) The term "printed circuits" originates from the technique of printing the electrical assembly, which may comprise, for example, a network of conductors, the stator of a switch or the rotor of a motor, on an insulated base by means of the selective deposition of a conductive material thereon in conformity with the desired circuit configuration. Electrolytic, electroless and mechanical (spraying, sputtering, etc.) techniques may be employed to provide this printing operation.

In addition to the above, the term "printed circuits" has been applied to components, assemblies or circuits formed by technique of selectively removing sections from an insulation-backed conductive blank, by selectively etching the non-conductive regions, the conductive components being protected by an etch resist printed on the blank in conformity with the desired circuit configuration.

In addition to the production of printed circuits, the methods of the invention are applicable to the production of other electrical components heretofore produced by solely mechanical means such as by stamping. In this group there are inductors, capacitor plates, conductor strips and the like which may be sheared from conductive stock or otherwise worked.

Burdening all of the foregoing techniques are certain limitations. Many of the techniques are not sufficiently accurate, require expensive machinery and are frequently impractical where a design is to be mounted on or laminated to an insulated base. Printed circuit techniques are in many cases incompatible with the requirements for mass production, needing elaborate environmental control, having a susceptibility to latent defects in the resultant product (and thus requiring rigorous quality control), and being relatively expensive. Frequently it is necessary to provide temporary supports during various production stages. Moreover, the strength of many printed circuits leaves much to be desired. Generally, only relatively thin, flat structures can be produced. This, together with high resistivity and tendencies to delaminate and deteriorate under certain conditions have limited the applicability of these circuits. In spite of this, the trend is toward wider adoption of printed circuit techniques, this being due in part to the increasing emphasis on weight reduction and miniaturization and to the prohibitive costs in time, labor and materials of conventional circuit wiring and cabling procedures.

It is thus an object of the invention to provide circuit-forming techniques which enable the rapid, inexpensive and simply effected production of electrical components and assemblies thereof.

Another object of the invention is to provide a circuit-forming process capable of being implemented on a mass production basis.

A further object of the invention is to provide a circuit-forming process in which assembly procedures are greatly facilitated.

A still further object of the invention is to provide a circuit-forming process which eliminates the problem of providing temporary support for electrical components or assemblies thereof during one or more stages of the production operation.

Another object of the invention is to provide methods for producing relatively massive and strong electrical components and assemblies thereof.

Another object of the invention is to provide a process for producing circuits having relatively high structural integrity and strength and having immunity from the usual tendencies to delaminate.

These and other objects and advantages of the invention will be set forth hereinafter and in part will be obvious herefrom, or may be learned by practice with the invention, the same being realized and attained by means of the steps, methods, compositions, combinations and improvements pointed out in the appended claims.

Briefly and generally the processes according to the invention comprise the partial formation of the desired circuit configuration in a conductive material, for example a copper blank with a residual structure or web being retained to facilitate handling and assembly, this web being dissolved away as by etching. To illustrate the practices of the invention, the production of rotors for electro-mechanical components will be described in terms of coining and etching methods.

Thus a further specific object of the invention is to provide a novel process for forming rotor components for dynamic electrical equipment such as motors, rotary switches, synchros, shaft-to-digital converters and the like.

The invention consists in the novel steps, methods, compositions, combinations and improvements herein shown and described.

Serving as exemplary illustrations of the procedures according to the invention are the drawings of which:

Figure 1:
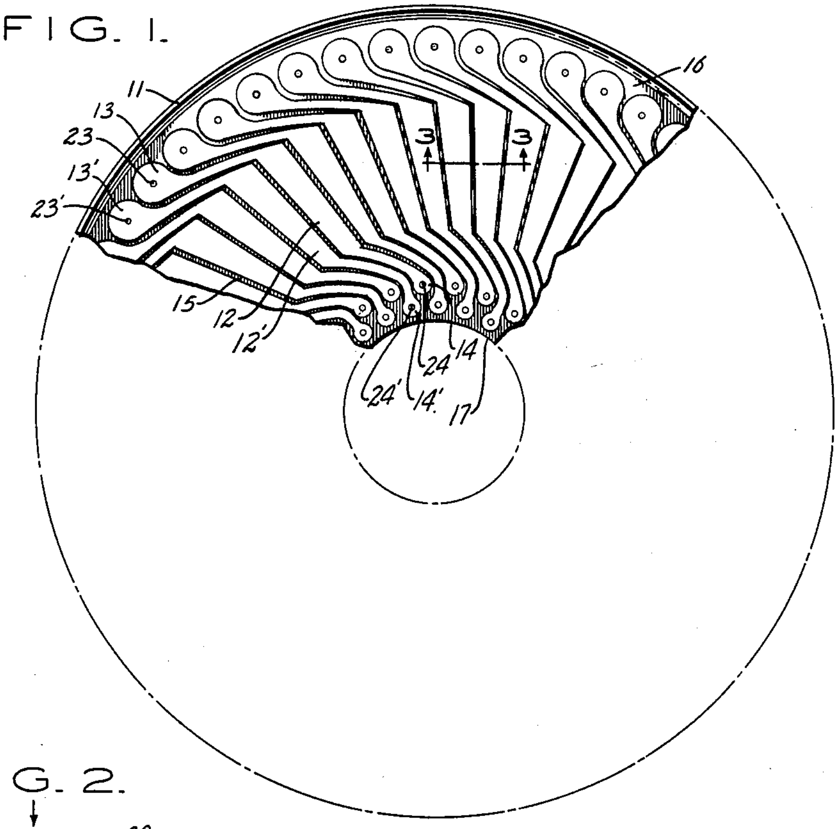
FIGURE 1 is a plan view partly schematic illustrating a partially formed electrical motor rotor.

As illustrated in FIGURE 1, a rotor produced according to the invention comprises a plurality of generally radial rotor segments 12 and 12' arranged adjacent one another to form a generally disk-shaped configuration. Each segment 12 includes external terminal section 13 and internal terminal section 14, conveniently but not essentially provided with apertures 23 and 24, respectively. In similar manner the adjacent segment 12' is provided with external terminal section 13' and internal terminal section 14', with holes 23' and 24', respectively. To provide for economy of space and materials the terminal sections 14 of segments 12 extend to a lesser degree towards the center of the rotor than do the adjacent terminal sections 14' of segments 12'. Rotors of this general type are disclosed in application Serial No. 792,733, filed February 12, 1959, now U.S. Patent No. 2,970,238.

Figure 2:
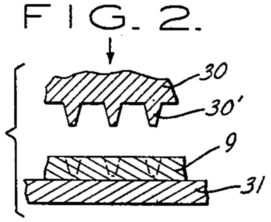
FIGURE 2 is an elevation fragmentary view in cross-section illustrating an initial stage of the process wherein a conductive material or blank is subjected to pressure applied by way of a coining die.
Figure 3:
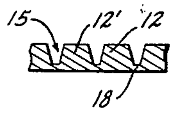
FIGURE 3 is an elevation fragmentary view in cross-section, taken along the lines 3—3 of FIGURE 1, illustrating a section of the rotor after the coining operation.

The circuit configuration comprising the above-described plurality of conductive segments is formed from a conductive material 9, FIGURE 2, which may initially be in the form of a sheet of stock. When the blank 9 has been processed, as described hereinafter, the resultant product has the appearance illustrated in FIGURE 1 with the conductive regions, i.e., segments, being formed in relief against a reduced thickness background which characterizes the regions 15 between adjacent segments, the central region 17 bounded by the terminals 14, 14' and the peripheral region 16 between the terminal sections 13, 13' and the external border 11. Also of reduced thickness are the regions corresponding with the holes 23, 23', 24 and 24'.

For producing the rotor component of FIGURE 1, a coining operation illustrated in FIGURE 2 is preferably employed although other methods such as molding and etching may be used. In the coining operation, the blank 9 of conductive material such as copper is subjected to the action of a coining die 30, 31 operated by a press not shown. The projections 30' on die 30 impress the grooves 15 into the blank 9 thereby forming in relief and outlining or delineating, conductive segments 12 and 12' against a residual background or web structure 18'. The sections 15 as well as the other reduced sections 16, 17, etc., of the web 18 correspond with the non-conductive or dielectric sections of the circuit, and these accordingly will be removed prior to completion of the rotor.

After a coining operation as aforesaid, two rotor disks thus impressed are placed, with their faces opposing against opposite sides of an insulator 20. The opposing disks are registered to form pluralities of conductor pairs which will ultimately be joined together to form the complete rotor. The performance of these steps are greatly facilitated by the structural integrity imparted to the rotor component by the web structure. Other steps which may also be performed at this time, such as trimming away surplus stock, forming center section 17, and the like, are similarly facilitated.

Figure 4:
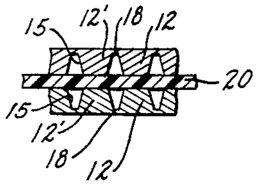
FIGURE 4 is an elevation fragmentary view in cross-section of a further stage in the process of manufacturing a rotor.

As seen in FIGURE 4, the mounting of each rotor component face down on opposing surfaces of the common insulator 20 results in orientation of web structure 18, on the exterior of the assembly, the grooves 15 between adjacent segments 12 and 12' being in the interior adjacent the insulator 20.

Figure 5:
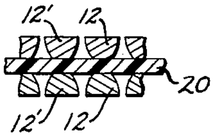
FIGURES 5 and 6 are elevation fragmentary views partly in section illustrating subsequent stages of the process of producing a rotor according to the invention.

Following this step the assembly is etched by known techniques employing etchants such as ferric chloride, until the residual structure 18 has been dissolved. Upon dissolution of section 18, each segment 12 becomes electrically separated or isolated from its adjoining segment 12', whereby the region between the segments becomes truly dielectric or non-conductive. The result of the etching proces is illustrated in FIGURE 5.

Figure 6:
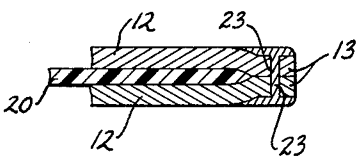

In addition to the dissolution of the dielectric-assigned portions of the impressed rotor disks, the segments of one disk are connected to electrically associated segments of the opposite disk to complete the circuits. This may be conveniently accomplished in a number of ways, for example by plating through holes 23, 23', 24 and 24', as illustrated in FIGURE 6. The plating material as seen in that figure is in electrical contact with the adjoining terminal sections 13, passing through the coaxial holes 23 in each section. The same procedure is applied with respect to the adjacent segment sections 13' and the internal terminal sections 14 and 14'.

Figure 7:
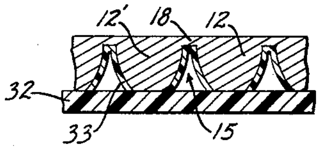
FIGURES 7 and 8 are elevation fragmentary views partly in section illustrating certain variations in the processes of the invention in enlarged scale.

In some cases it may be convenient to dissolve the dielectric sections of the impressed blank prior to permanent assembly to an insulator. In this event, the impressed pattern may be temporarily mounted and pressed face down on a suitable backing or support such as a pressure-sensitive sheet 32, FIGURE 7, in order to provide means for maintaining the conductive segments in predetermined relationship after the web portion 18 has been removed.

Figure 8:
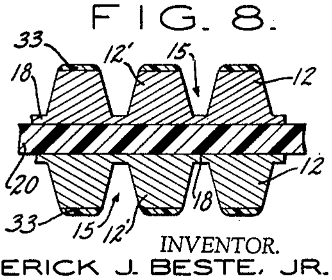

In some cases it has been found that the etchant prematurely gains access to a dielectric region, e.g., the grooves 15 between the segments, and attacks this region before the remainder of the web 18 has been removed. To eliminate this undercutting into the conductor segments, an etch resist 33, FIGURE 7, such as acrylic resin, may be applied to the impressed face of the circuit configuration, as by spraying.

Where the nature of the circuit configuration and basic materials so dictate, the web section 18 may be mounted adjacent the insulator 20 as shown in FIGURE 8 and the component subsequently etched to remove the web. Roller printing of a resist 33 may be preliminarily employed where necessary with this configuration.

While the basic steps of the process have been described above it should be understood that various modifications thereto according to the particular circuit being manufactured will be readily apparent to those skilled in the art. Moreover, the application of the processes of the invention are eminently suited to circuits other than a rotor, this component having been chosen for illustration only. Thus, a single-sided circuit may be produced according to the invention.

It should also be understood that by manufacturing rotors or other circuits according to the invention, the pressing operation may be accomplished in a number of successive steps, each of which impresses a portion of the circuit configuration into the conductive blank, this procedure being followed until the total circuit is impressed.

It may be seen from the above that the techniques of the invention greatly facilitate the production of electrical components and assemblies. The coining operation lends itself readily to mass production and is adaptable to the working of relatively thick stock. Temporary retainer of the residual web provides important handling ease thereby also contributing to rapid and efficient production rates.

The invention in its broader aspects is not limited to the specific steps, methods, compositions, combinations and improvements shown and described but departures may be made therefrom within the scope of the accompanying claims without departing from the principles of the invention and without sacrificing its chief advantages.

What is claimed is:

1. A process for the production of electrical rotors having a plurality of conductive segments separated by dielectric regions and wherein said segments each include a terminal, comprising the steps of applying a mechanical force selectively to impress a design delineating said conductive segments into a conductive member, assembling two of said impressed members in registration and with impressed faces opposing to a common insulator, etching the exposed faces of both said impressed members to remove the region delineating said conductive segments whereby said region is rendered dielectric and connecting said terminals of the segments of one impressed member to the corresponding terminals of the segments of the opposing impressed member to thereby form a plurality of electrical circuits.

2. A process according to claim 1 in which said mechanical force is selectively applied to cause plastic flow in said conductive member.

3. A process according to claim 1 in which said application of mechanical force comprises a coining operation.

4. A process according to claim 1 including the steps of applying an etch resist to at least one of said impressed members.

References Cited in the file of this patent

UNITED STATES PATENTS

| | | |
|---|---|---|
| 2,427,144 | Jansen | Sept. 9, 1947 |
| 2,695,351 | Beck | Nov. 23, 1954 |
| 2,772,501 | Malcolm | Dec. 4, 1956 |
| 2,777,192 | Albright et al. | Jan. 15, 1957 |
| 2,781,849 | Bladergroen et al. | Feb. 19, 1957 |
| 2,898,521 | Creveling | Aug. 4, 1959 |
| 2,937,358 | Bulger | May 17, 1960 |
| 2,943,966 | Leno et al. | July 5, 1960 |
| 2,974,284 | Parker | Mar. 7, 1961 |
| 2,988,839 | Greenman et al. | June 20, 1961 |
| 2,990,310 | Chan | June 27, 1961 |

OTHER REFERENCES

I.B.M. Technical Disclosure Bulletin (E. D. Miles), "Flush Printed Circuits," vol. 1, No. 2, August 1958.